(12) United States Patent
Furuya et al.

(10) Patent No.: US 6,639,294 B2
(45) Date of Patent: Oct. 28, 2003

(54) SEMICONDUCTOR DEVICE HAVING A DEVICE FORMATION REGION PROTECTED FROM A COUNTERELECTROMOTIVE FORCE

(75) Inventors: Keiichi Furuya, Hyogo (JP); Fumitoshi Yamamoto, Tokyo (JP); Tomohide Terashima, Tokyo (JP)

(73) Assignees: Mitsubishi Denki Kabushiki Kaisha, Tokyo (JP); Ryoden Semiconductor System Engineering Corporation, Itami (JP)

( * ) Notice: Subject to any disclaimer, the term of this patent is extended or adjusted under 35 U.S.C. 154(b) by 0 days.

(21) Appl. No.: 10/191,472

(22) Filed: Jul. 10, 2002

(65) Prior Publication Data

US 2003/0146487 A1 Aug. 7, 2003

(30) Foreign Application Priority Data

Feb. 1, 2002 (JP) ........................................ 2002-026091

(51) Int. Cl.⁷ .............................................. H01L 29/41
(52) U.S. Cl. ..................... 257/503; 257/501; 257/526; 257/547
(58) Field of Search ................................ 257/503, 501, 257/526, 547

(56) References Cited

U.S. PATENT DOCUMENTS

| | | | | |
|---|---|---|---|---|
| 3,931,634 A | * | 1/1976 | Knight | 257/547 |
| 4,466,011 A | * | 8/1984 | Van Zanten | 257/547 |
| 5,495,123 A | * | 2/1996 | Canclini | 257/500 |
| 5,861,656 A | * | 1/1999 | Keri | 257/491 |
| 5,892,268 A | * | 4/1999 | Yashita et al. | 257/500 |

FOREIGN PATENT DOCUMENTS

JP 05-326844 12/1993

\* cited by examiner

*Primary Examiner*—Jerome Jackson
(74) *Attorney, Agent, or Firm*—Burns, Doane, Swecker & Mathis, LLP

(57) ABSTRACT

A semiconductor device includes an epitaxial layer formed on a P type silicon substrate; a P+ diffusion layer for dividing the epitaxial layer into an N– epi layer, which constitutes a device formation region, and an N– epi layer, which constitutes an invalid area; and an aluminum wire for electrically connecting the N– epi layer (invalid area) to the P+ diffusion layer. Since the potential of the N– epi layer (invalid area) can be made equal to that of the P+ diffusion layer, it is possible to prevent the electron supply from the P+ diffusion layer to the invalid area even when electrons are supplied to the device formation region by a counterelectromotive force produced by a load having an inductance L.

8 Claims, 7 Drawing Sheets

SEMICONDUCTOR DEVICE HAVING A DEVICE FORMATION REGION PROTECTED FROM A COUNTERELECTROMOTIVE FORCE

BACKGROUND OF THE INVENTION

1. Field of the Invention

The present invention relates to semiconductor devices, and more particularly to a semiconductor device in which a separation (isolation) diffusion layer separates a plurality of device formation regions from one another.

2. Background Art

FIG. 7 is a plan view showing the structure of a conventional semiconductor device. FIG. 8 is a schematic cross-sectional view of the semiconductor taken along chain line II–II' device of FIG. 7. This semiconductor device is used as, for example, a driver for automobiles, motors, etc. FIG. 8 shows a state in which devices in an epitaxial layer (hereinafter referred to as an epi layer) on a P type silicon substrate 101 are separated from one another. FIG. 9 is also a schematic cross-sectional view of the semiconductor device obtained as a result of additionally forming aluminum wires 106 in the example of FIG. 8.

As shown in FIG. 8, a P+ diffusion layer 103, which constitutes a separation diffusion layer, divides the N– epi layer formed on a P type silicon substrate 101 into an N– epi layer 102 and N– epi layers 104. The N– epi layer 102 constitutes an area adjacent to the dicing area around the chip and is hereinafter referred to as an invalid area, while the N– epi layers 104 each constitute a device formation region. A device separation oxide film 105 is formed on each predetermined area on the N– epi layer 102 and the P+ diffusion layer 103 by the use of the so-called LOCOS method.

FIG. 10 is a schematic cross-sectional view showing a MOS transistor and an NPN bipolar transistor formed in N– epi layers 104 in detail.

As shown in FIG. 10, a DMOS (Double Diffusion MOS) device 112 is formed of P– diffusion layers 107 (backgate regions), N+ diffusion layers 108 (source/drain regions), a gate oxide film 110, and a gate wire 111 in an N– epi layer 104.

On the other hand, an NPN bipolar transistor 113 is formed of an N+ diffusion layer 121, a P diffusion layer 122, an N diffusion layer 123, and an N+ diffusion layer 124 in another N– epi layer 104 (device formation region) separated by the P+ diffusion 103, which constitutes an active area. The N+ diffusion layer 121 and the P diffusion layer 122 constitute the emitter region and the base region, respectively, whereas the N diffusion layer 123 and the N+ diffusion layer 124 collectively constitute the collector region.

Further, as shown in FIG. 9, the aluminum wires 106 are formed on both the N– epi layer 102 (invalid area) and the P+ diffusion layer 103 adjacent to the invalid area. The aluminum wires 106 are each used to apply a predetermined voltage to the P+ diffusion layer 103 or N– epi layer 102. To do this, the aluminum wires 106 on the P+ diffusion layer 103 are formed separately and independently of the aluminum wires 106 on the N– epi layer 102.

However, when a load having an inductance component L (hereinafter referred to as an L load), such as a motor, was connected to a semiconductor device formed in a device formation region in the above conventional structure, a problem arose that device malfunction occurred due to a counterelectromotive force generated by the L load.

FIG. 11 is a schematic diagram showing a portion of an output circuit used in drivers for automobiles, motors, etc. It should be noted that N channel MOS transistors 125 and 126 are formed in device formation regions on the P type silicon substrate 101, and collectively constitute a driver output circuit. The drain of the N channel MOS transistor 125 and the source of the N channel MOS transistor 126 are connected to an L load (namely a coil 127 in the figure) such as a motor. Further, the source of the N channel MOS transistor 125 is grounded, while a positive potential Vcc is applied to the drain of the N channel MOS transistor 126.

A description will be made of the counterelectromotive force produced by the L load with reference to FIG. 11. First, the N channel MOS transistor 126 is turned on to cause a current to flow in the coil 127, producing an induced magnetic field in the coil 127. Then, if the N channel MOS transistor 126 is turned off, the N channel MOS transistor 125 is supplied with electrons by an induced current generated by the magnetic field in the coil 127. The above phenomenon in which an induced current flows after turning off the N channel MOS transistor 126 is called 'a counterelectromotive force by an L load'.

FIG. 12 includes both a schematic cross-sectional view (similar to that of FIG. 9) of the semiconductor device taken along chain line I–I' of FIG. 2 and a schematic diagram for illustrating a problem with the conventional structure. As shown in FIG. 12, in the conventional semiconductor device structure, a parasitic NPN transistor 114 is unintentionally formed such that its emitter is an N– epi layer 104 (device formation region), its base is the P type silicon substrate 101 and P+ diffusion layer 103, and its collector is the N– epi layer 102 (invalid area).

In addition, a parasitic NPN transistor 115 is unintentionally formed such that its emitter is the N– epi layer 102 (invalid area), and its base is the P type silicon substrate 101 and the P+ diffusion layer 103, and its collector is an N– epi layer 104 (device formation region). Thus, both the collector of the parasitic NPN transistor 114 and the emitter of the parasitic NPN transistor 115 are formed of the N– epi layer 102 (invalid area), which is formed in a rectangular ring along the dicing area as shown in FIG. 7. Therefore, the collector of the parasitic NPN transistor 114 and the emitter of the parasitic NPN transistor 115 are electrically connected to each other.

First, a description will be made of what causes the malfunction when an L load is connected in the conventional structure. If an L load is connected to a device such as a MOS transistor or an NPN bipolar transistor formed in an N– epi layer 104, electrons flow from the N– epi layer 104 (device formation region) to the P type silicon substrate 101 due to a counterelectromotive force generated by the L load. This activates the parasitic NPN transistor 114 which in turn supplies electrons to the N– epi 102 layer (invalid area).

Since aluminum wires 106 are formed on the N– epi layer 102 (invalid area), the resistance component 120 of the N– epi layer 102 is low. Therefore, the epi layer 102 (invalid area) supplied with the electrons acts as the emitter of the parasitic NPN transistor 115.

Generally, the P type silicon substrate 101 is connected to GND (grounded) such that its potential is 0 V. However, it is difficult to set all the areas (portions) to 0 V, producing a potential difference on the order of $10^{-1}$ V at some places. Then, if the potential of the P type silicon substrate 101 (which acts as the base of the parasitic NPN transistor 115)

varies, the parasitic NPN transistor 115 operates, and as a result electrons flow into another device formation region in the active area. This phenomenon has caused the problem that malfunction of a device occurs in the device formation region into which the electrons have flown.

SUMMARY OF THE INVENTION

In view of the foregoing, the present invention has been made, and an object of the present invention is to provide a semiconductor device capable of preventing occurrence of malfunction caused by a counterelectromotive force produced by an L load.

According to one aspect of the present invention, a semiconductor device comprises a semiconductor layer formed on a semiconductor substrate, a separation diffusion layer, and a conductive film. The separation diffusion layer divides the semiconductor layer into a device formation area, which is an active area, and an invalid area outside the active area. The conductive film is for electrically connecting the invalid area of the semiconductor layer to the separation diffusion layer.

Since a semiconductor layer constituting an invalid area is electrically connected to a separation diffusion layer, the potential of the invalid area can be made equal to that of the separation diffusion layer. Therefore, even when electrons are supplied to a device formation region by a counterelectromotive force produced by an L load connected to a device formation region, it is possible to prevent electron supply from the separation diffusion layer to the invalid area, thereby preventing device malfunction.

Other and further objects, features and advantages of the invention will appear more fully from the following description.

DETAILED DESCRIPTION OF THE PREFERRED EMBODIMENTS

First Embodiment

Figure 1:
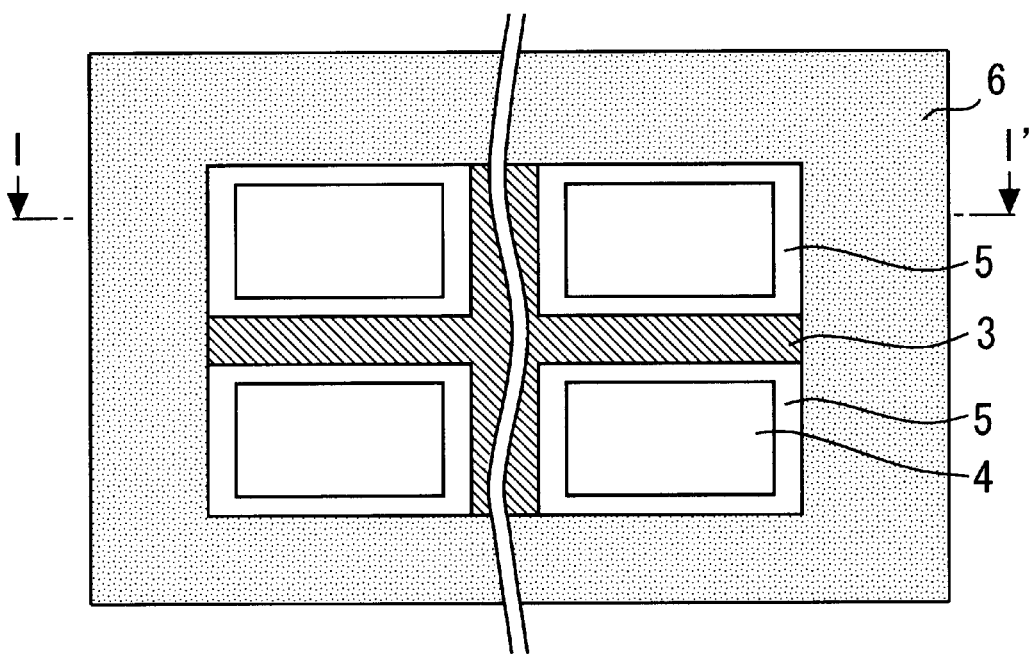
FIG. 1 is a plan view of a semiconductor device having DMOS devices and NPN bipolar transistors therein according to a first embodiment of the present invention.
Figure 2:
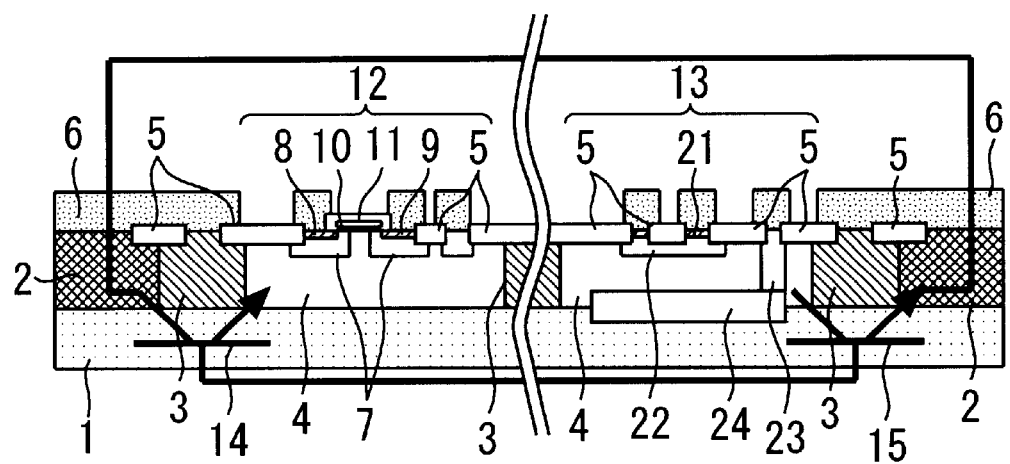
FIG. 2 is a schematic cross-sectional view of the semiconductor device of taken along chain line I–I' FIG. 1.

FIG. 1 is a plan view of a semiconductor device having DMOS devices and NPN bipolar transistors therein according to a first embodiment of the present invention. FIG. 2 is a schematic cross-sectional view of the semiconductor device of taken along chain line I–I' FIG. 1. This semiconductor device constitutes a driver for automobiles, motors, etc. and therefore is connected to an L load such as a motor.

As shown in FIGS. 1 and 2, a P+ diffusion layer 3, which is a separation diffusion layer, divides the N– epi layer formed on a P type silicon substrate 1 into an N– epi layer 2 and N– epi layers 4. The N– epi layer 2 constitutes the invalid area, while the N– epi layers 4 constitute device formation regions. The P+ diffusion layer 3 (separation diffusion layer) and the N– epi layers 4 (device formation regions) collectively constitute an active area on the P type silicon substrate 1. One N– epi layer 4 (device formation area) includes a DMOS device 12 formed of a P– diffusion layer 7 (backgate region), an N+ diffusion layer 8 (source region), an N+ diffusion layer 9 (drain region), a gate oxide film 10, and a gate wire 11.

Another N– epi layer 4 includes an NPN bipolar transistor 13 formed of an N+ diffusion layer 21, a P diffusion layer 22, an N diffusion layer 23, and an N+ diffusion layer 24. The N+ diffusion layer 21 and the P diffusion layer 22 constitute the emitter region and the base region, respectively, whereas the N diffusion layer 23 and the N+ diffusion layer 24 collectively constitute the collector region.

Figure 12:
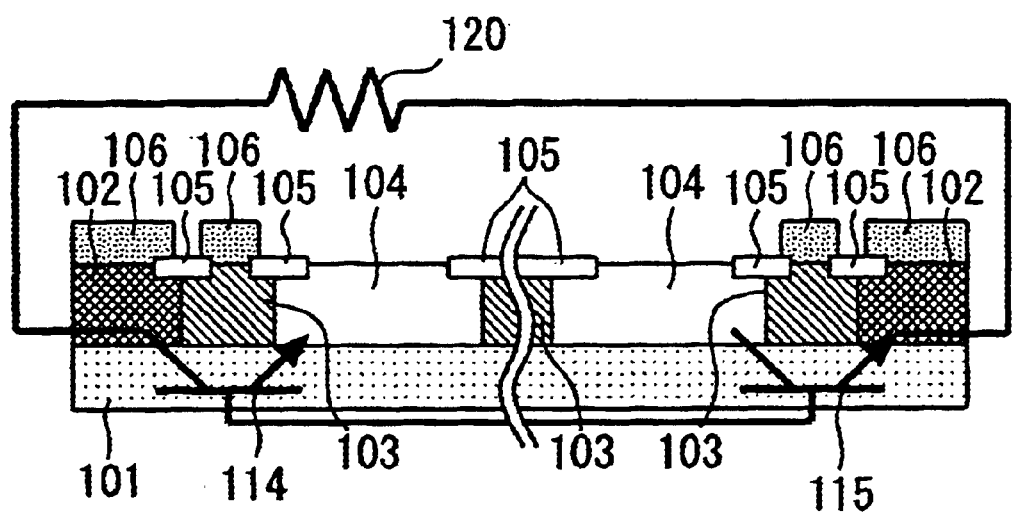
FIG. 12 is a schematic diagram for illustrating a problem with the conventional structure.

Furthermore, as described in FIG. 12, in the semiconductor device of the first embodiment, a parasitic NPN transistor 14 is unintentionally formed such that its emitter is an N– epi layer 4 (device formation region), its base is the P type silicon substrate 1 and the P+ diffusion layer 3, and its collector is the N– epi layer 2 (invalid area).

In addition, a parasitic NPN transistor 15 is also unintentionally formed such that its emitter is the N– epi layer 2 (invalid region), its base is the P type silicon substrate 1 and the P+ diffusion layer 3, and its collector is an N– epi layer 4 (device formation region).

As shown in FIGS. 1 and 2, an aluminum wire 6 is formed on both the P+ diffusion layer 3 (separation diffusion layer) and the N– epi layer 2 (invalid area), bridging them. Thus, the P+ diffusion layer 3 and the N– epi layer 2 are electrically connected to each other through the aluminum wire 6.

With this arrangement, the potential of the N– epi layer 2 (invalid area) can be made equal to those of the P+ diffusion layer 3 and the P type silicon substrate 1. Therefore, even when electrons are supplied from an N– epi layer 4 (device formation region) to the P type silicon substrate 1 by a counterelectromotive force produced by an L load of a device connected to the drain of the DMOS device 12, it is possible to prevent the parasitic NPN transistor 14 from being activated.

Since the parasitic NPN transistor 14 does not operate, it is possible to prevent electron supply from the N– epi layer 2 (invalid area), which acts as the emitter region of the parasitic NPN transistor 15, to the P type silicon substrate 1. Therefore, electrons are not supplied to the collector (N diffusion layer 23 and N+ diffusion layer 24) of the NPN bipolar transistor device 13 in another device formation region within the active area through the parasitic NPN transistor 15. With this arrangement, it is possible to prevent malfunction of the device connected to the collector of the NPN bipolar transistor device 13.

Second Embodiment

Figure 3:
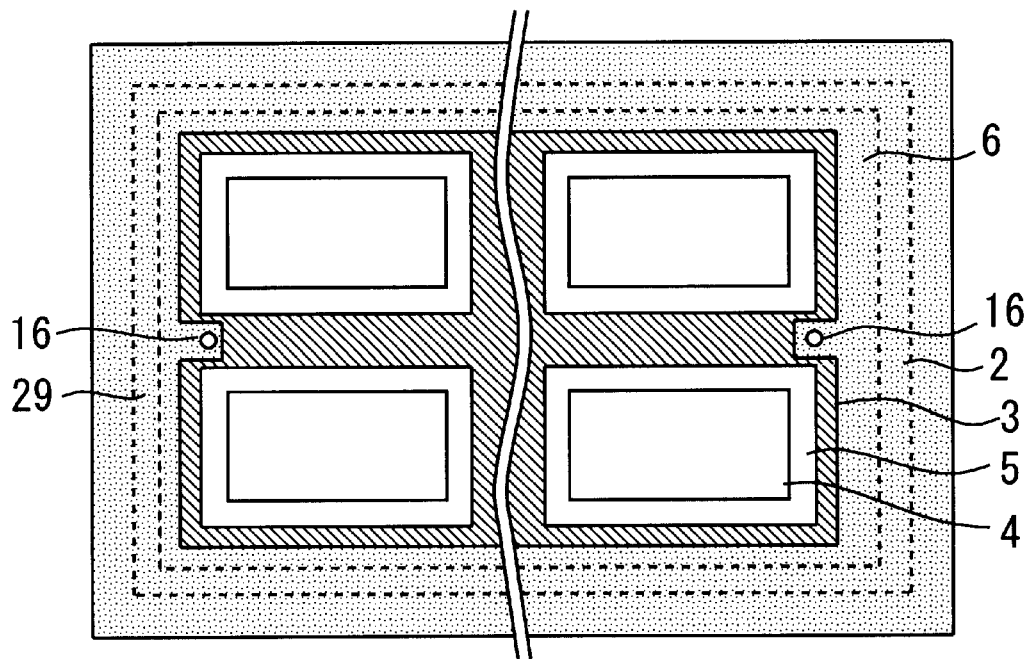
FIG. 3 is a plan view of a semiconductor device according to a second embodiment of the present invention.

FIG. 3 is a plan view of a semiconductor device according to a second embodiment of the present invention. In the second embodiment, the aluminum wire 6, which has been described in the first embodiment, covers only a portion of the surface of the P+ diffusion layer 3 in the active area. Specifically, as shown in FIG. 3, the aluminum wire 6 is formed such that the P+ diffusion layer 3 in the active area and the aluminum wire 6 are joined together at one or more connection portions 16, and the aluminum wire 6 is formed on only the portions of the surface of the P+ diffusion layer 3 around the connection portions 16. The other configurations are the same as those of the first embodiment.

According to the second embodiment, since the aluminum wire covers only the portions of the surface of the P+ diffusion layer 3 around the connection portions 16, the area of the portions of the aluminum wire 6 which overlap the surface of the P+ diffusion layer 3 can be minimized. With this arrangement, the portions of the surface of the P+ diffusion layer 3 not covered with the aluminum wire 6 can be used as an N type device formation region to form another device. Therefore, the second embodiment can produce the same effect as that of the first embodiment, and furthermore provide a semiconductor device having an extended active area.

Third Embodiment

Figure 4:
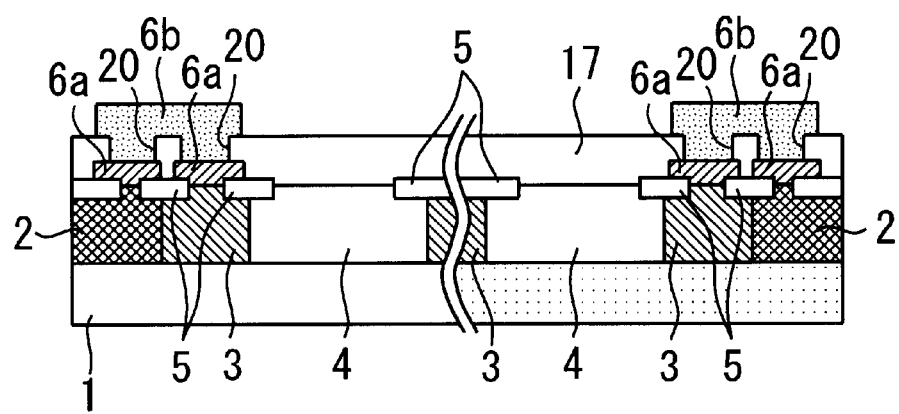
FIG. 4 is a schematic cross-sectional view of a semiconductor device according to a third embodiment of the present invention.

FIG. 4 is a schematic cross-sectional view of a semiconductor device according to a third embodiment of the present invention. In the third embodiment, a multilayered aluminum wire is used to connect the N− epi layer 2 (invalid region) to the P+ diffusion layer 3 in the active area. The other configurations are the same as those of the first embodiment.

The multilayered aluminum wire comprises: aluminum wires 6a each formed on the N− epi layer 2 or the P+ diffusion layer 3; and an aluminum wire 6b formed on the aluminum wires 6a and connecting the aluminum wires 6a on the N− epi layer 2 to the aluminum wires 6a on the P+ diffusion layer 3. An interlayer insulation film 17 is formed on the aluminum wires 6a, which are connected to the aluminum wire 6b through contact holes 20.

In the structure of the third embodiment which uses the aluminum wire 6b, the formation of the aluminum wires 6a on the P+ diffusion layer 3 in the active area can be limited to only the area in contact with the P+ diffusion layer 3. Therefore, it is possible to further extend the portions of the surface of the P+ diffusion layer 3 not covered with the aluminum wire 6a (that is, further extend the active area) as compared with the second embodiment in which the P+ diffusion layer 3 and the N− epi layer 2 (invalid area) are connected by the use of only the aluminum wire 6a. In this case, the portions of the surface of the P+ diffusion layer 3 not covered with the aluminum wires 6 can be used as an N type epi layer to form another device.

Furthermore, the use of the aluminum wires 6a and 6b layered in a multilayered manner makes it possible to reduce the area of the portions of the aluminum wires 6a on the active area that electrically connects the N− epi layer 2 to the P+ diffusion layer 3. This means that the area of the other aluminum wires on the active area can be increased. Thus, it is possible to form the other aluminum wires such that their width and wiring interval are large, eliminating the need for excessive miniaturization of the aluminum wires and thereby reducing the production cost.

Fourth Embodiment

Figure 5:
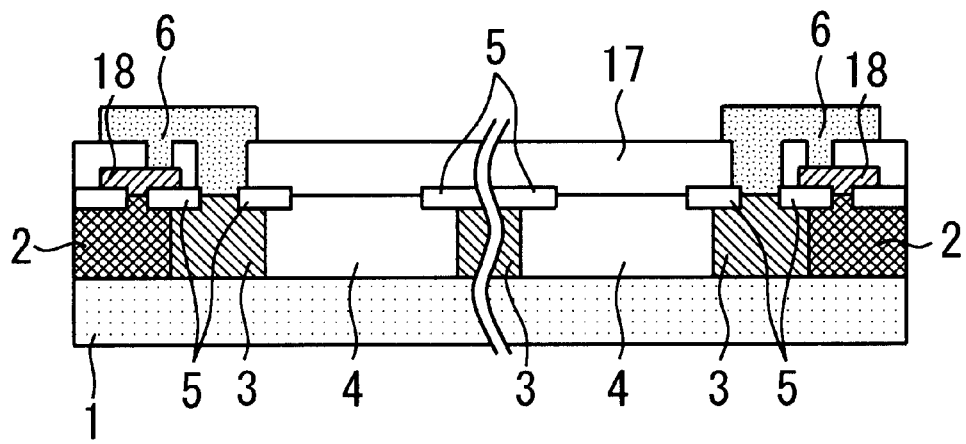
FIG. 5 is a schematic cross-sectional view of semiconductor devices according to a fourth embodiment of the present invention.

FIGS. 5 an 6 are schematic cross-sectional views of semiconductor devices according to a fourth embodiment of the present invention. In the semiconductor device of FIG. 5, a polycrystalline silicon film 18 doped with N+ is formed on the N− epi layer 2 (invalid area). In addition, the aluminum wire 6 connected to the P+ diffusion layer 3 in the active area is connected to the polycrystalline silicon film 18.

Figure 6:
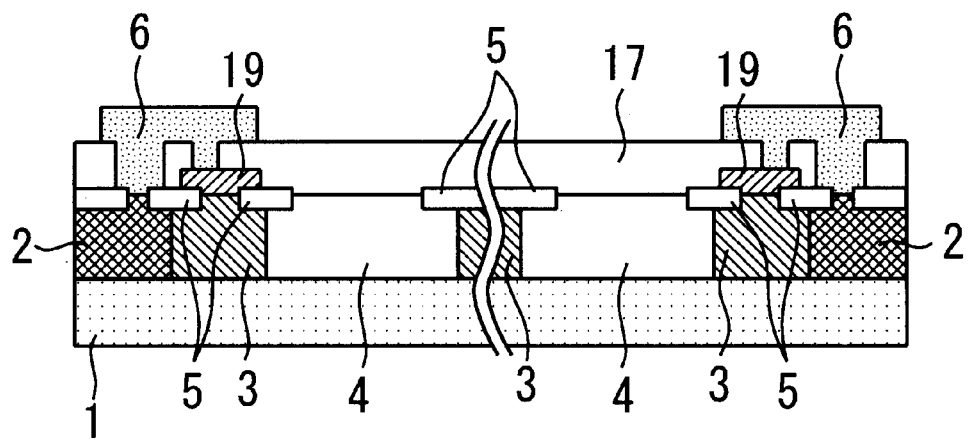
FIG. 6 is a schematic cross-sectional view of semiconductor devices according to a fourth embodiment of the present invention.
Figure 7:
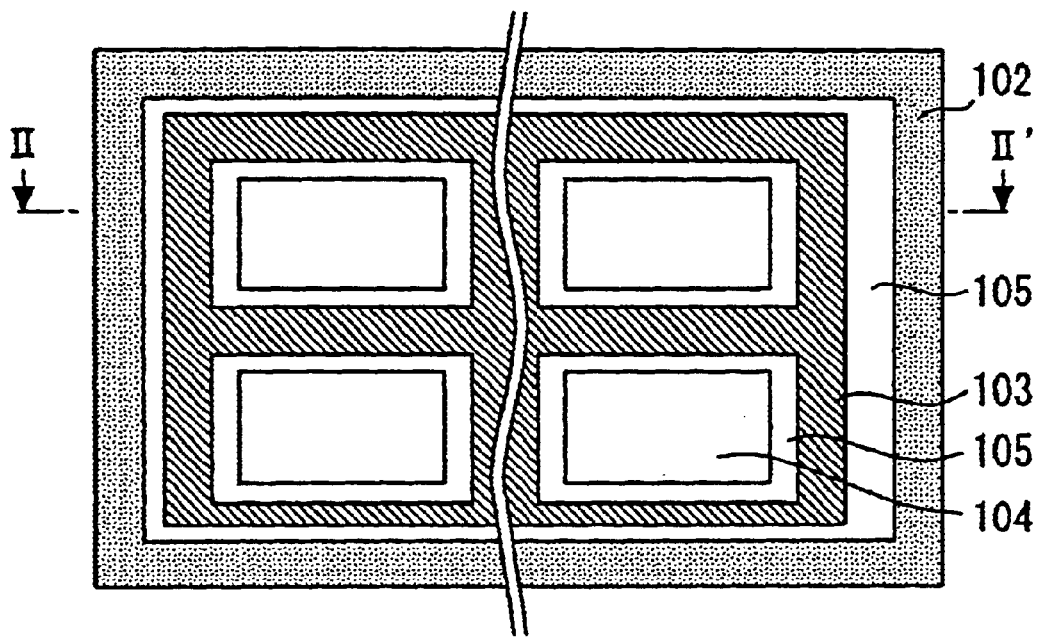
FIG. 7 is a plan view showing the structure of a conventional semiconductor device.
Figure 8:
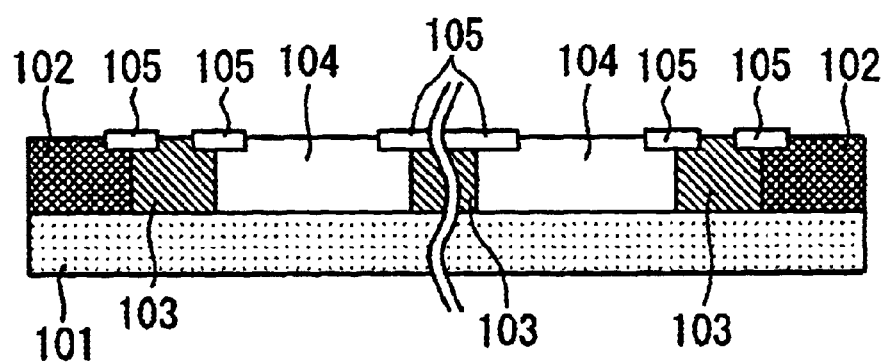
FIG. 8 is a schematic cross-sectional view of the semiconductor taken along chain line II–II' device of FIG. 7.
Figure 9:
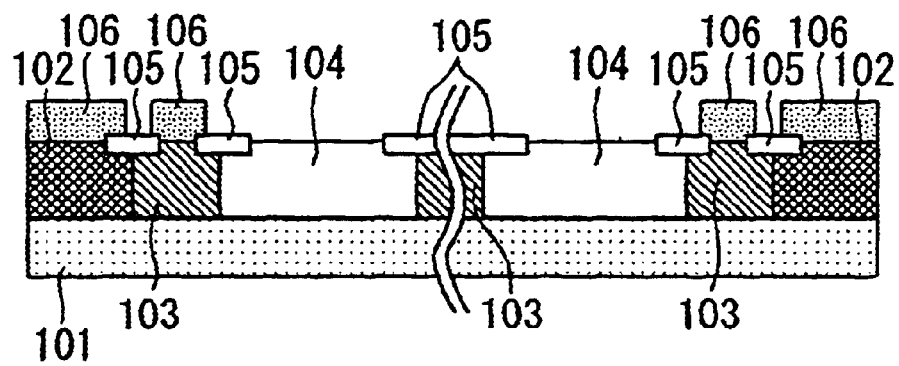
FIG. 9 is also a schematic cross-sectional view of the semiconductor device obtained as a result of additionally forming aluminum wires 106 in the example of FIG. 8.
Figure 10:
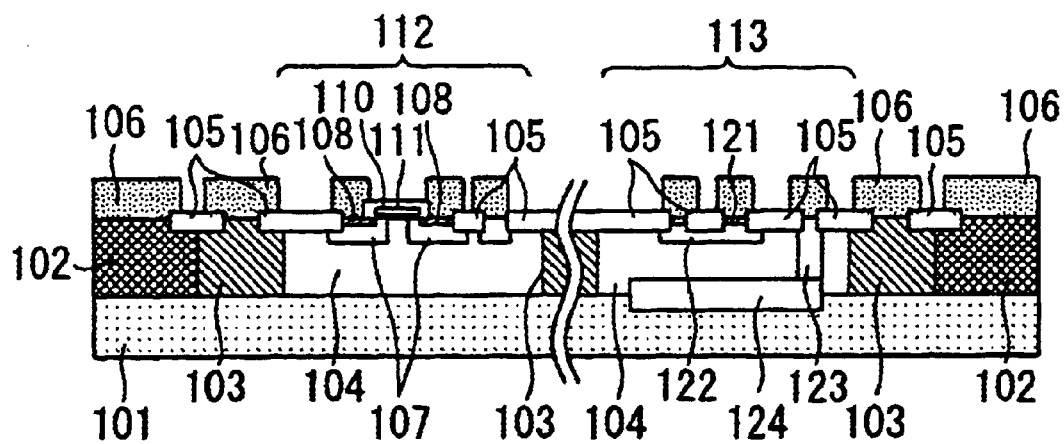
FIG. 10 is a schematic cross-sectional view showing a MOS transistor and an NPN bipolar transistor formed in N– epi layers 104 in detail.
Figure 11:
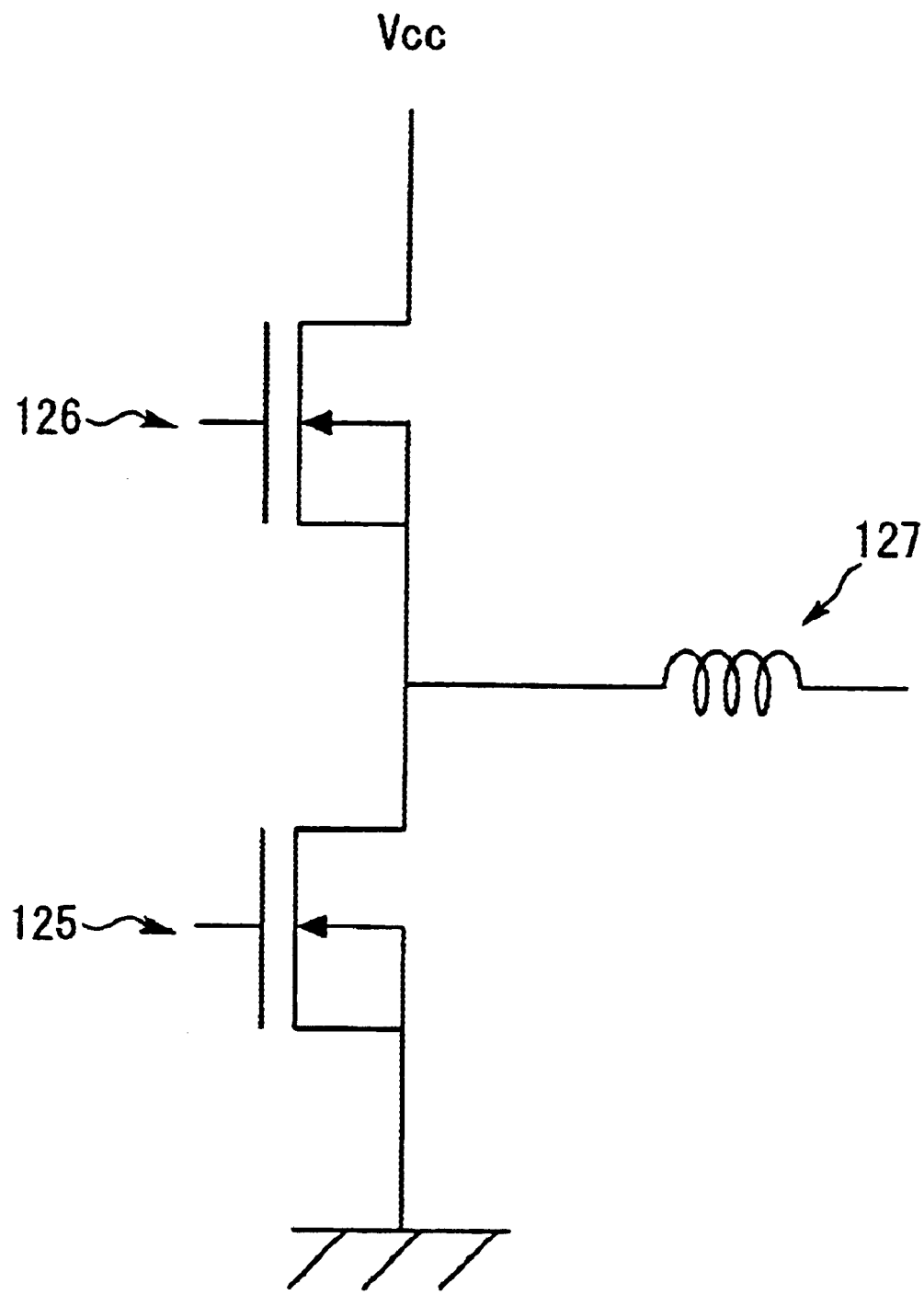
FIG. 11 is a schematic diagram showing a portion of an output circuit used in drivers for automobiles, motors, etc.

In the semiconductor device of FIG. 6, on the other hand, a polycrystalline silicon film 19 doped with P+ is formed on the P+ diffusion layer 3 in the active area, and the aluminum wire 6 connected to the N− epi layer 2 (invalid area) is connected to the polycrystalline silicon film 19. The other configurations of the fourth embodiment are the same as those of the first embodiment.

According to the fourth embodiment, the formation of the connection portion between the aluminum wire 6 and the P+ diffusion layer 3 shown in FIG. 5 and the connection portion between the polycrystalline silicon film 19 and the P+ diffusion layer 3 shown in FIG. 6 can be limited to their contact portions, reducing the area of the portion of the aluminum wire 6 on the active area which connects the N− epi layer 2 to the P+ diffusion layer 3. Therefore, since the area of the other aluminum wire on the active area can be increased, it is possible to form the other aluminum wire such that its width and wiring interval are large, eliminating the need for excessive miniaturization of the other aluminum wire. Furthermore, the formation of the polycrystalline silicon films 18 and 19 can be carried out at the same time with the gate process for the device formation regions, reducing the number of semiconductor device fabrication processes to be employed, as compared with the connection structure by the use of the multilayered wire according to the third embodiment.

In the above embodiments, even though DMOS devices and NPN bipolar transistor devices are formed in device formation regions, the present invention is not limited to these specific devices. Diffusion resistors or devices made up of a combination of the above devices may be formed instead.

Further, even though the aluminum wire 6 is used to connect the N− epi layer 2 and the P+ diffusion layer 3, a metal wire of Cu or W may be employed instead.

Configured as described above, the present invention has the following effects.

Since a semiconductor layer constituting an invalid area is electrically connected to a separation diffusion layer, the potential of the invalid area can be made equal to that of the separation diffusion layer. Therefore, even when electrons are supplied to a device formation region by a counterelectromotive force produced by an L load connected to a device formation region, it is possible to prevent electron supply from the separation diffusion layer to the invalid area, thereby preventing device malfunction.

By forming a conductive film such that it covers a separation diffusion layer and a semiconductor layer constituting an invalid area, it is possible to reliably connect the separation diffusion layer and the invalid area and make their potentials equal to each other.

By forming a conductive film on a portion of the surface of a separation diffusion layer or a portion of the surface of a semiconductor layer constituting an invalid area, it is possible to form another device in the other portion of the separation diffusion layer not covered with the conductive film, obtaining a semiconductor device having an extended active area.

By using a multilayer structure made up of a first conductive film and a second conductive film, it is possible to reduce the area of the portion of the first conductive film which connects a semiconductor layer constituting an invalid area to a separation diffusion layer, increasing the area of the other conductive film on the active area and thereby eliminating the need for excessive miniaturization of the conductive film. With this arrangement, the production cost can be reduced.

By limiting the formation of a first conductive film to only a required area, it is possible to reduce the area of the portion of the first conductive film on a separation diffusion layer in the active area. With this arrangement, another device can be formed in the other area not covered with the first conductive film within the active area.

By using a polycrystalline silicon film containing an impurity as the first conductive film, it is possible to carry out the formation of the first conductive film at the same time with the gate formation process.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-26091, filed on Feb. 1, 2002 including specification, claims, drawings and summary, on which the Convention priority of the present application is based, are incorporated herein by reference in its entirety.

What is claimed is:

1. A semiconductor device comprising:
   a semiconductor layer formed on a semiconductor substrate;
   a separation diffusion layer dividing said semiconductor layer into a device formation area, which is an active area, and an invalid area outside said active area; and
   a conductive film which has a planar ring shape on said invalid area of the semiconductor layer and said separation diffusion layer for electrically connecting said invalid area of said semiconductor layer to said separation diffusion layer.

2. The semiconductor device according to claim 1, wherein said conductive film is formed such that said conductive film covers both said separation diffusion layer and said invalid area of said semiconductor layer.

3. The semiconductor device according to claim 1, wherein said conductive film is formed on only a portion of said separation diffusion layer or a portion of said invalid area of said semiconductor layer.

4. The semiconductor device according to claim 2, wherein said conductive film is formed on only a portion of said separation diffusion layer or a portion of said invalid area of said semiconductor layer.

5. The semiconductor device according to claim 1, where said conductive film includes:
   first conductive films each formed on said separation diffusion layer or said invalid area of said semiconductor layer; and
   a second conductive film for connecting said first conductive film on said separation diffusion layer to said first conductive film on said invalid area of said semiconductor layer.

6. The semiconductor device according to claim 5, wherein said first conductive films are each formed on only a portion of said separation diffusion layer or a portion of said invalid area of said semiconductor layer.

7. The semiconductor device according to claim 5, wherein said first conductive films are made of a polycrystalline silicon film containing an impurity.

8. The semiconductor device according to claim 6, wherein said first conductive films are made of a polycrystalline silicon film containing an impurity.

* * * * *